(12) United States Patent
Gill et al.

(10) Patent No.: US 7,799,427 B2
(45) Date of Patent: Sep. 21, 2010

(54) CVD DIAMOND IN WEAR APPLICATIONS

(75) Inventors: Jaswinder Singh Gill, HH Amersfoort (NL); Clive Edward Hall, PC Nijmegen (NL); Daniel James Twitchen, Berkshire (GB); Geoffrey Alan Scarsbrook, Berkshire (GB)

(73) Assignee: Element Six Limited, Ballasalla (GB)

( * ) Notice: Subject to any disclaimer, the term of this patent is extended or adjusted under 35 U.S.C. 154(b) by 928 days.

(21) Appl. No.: 10/546,188

(22) PCT Filed: Feb. 19, 2004

(86) PCT No.: PCT/IB2004/000416

§ 371 (c)(1),
(2), (4) Date: Oct. 3, 2006

(87) PCT Pub. No.: WO2004/074557

PCT Pub. Date: Sep. 2, 2004

(65) Prior Publication Data

US 2007/0054124 A1    Mar. 8, 2007

(30) Foreign Application Priority Data

Feb. 19, 2003    (GB) ................. 0303860.1

(51) Int. Cl.
*B32B 9/00*      (2006.01)
*B32B 27/20*     (2006.01)

(52) U.S. Cl. .................. 428/408; 428/698; 408/145

(58) Field of Classification Search .................. 428/408, 428/698, 699; 72/467; 408/145
See application file for complete search history.

(56) References Cited

U.S. PATENT DOCUMENTS 6,007,916 A * 12/1999 Satoh et al. ................. 428/408

FOREIGN PATENT DOCUMENTS

EP    0 024 757       3/1981
EP    0 316 856 A1    5/1989

(Continued)

OTHER PUBLICATIONS

P. Kania, et al., Diamond and Related Materials, vol. 4, pp. 425-428 (1995).

(Continued)

*Primary Examiner*—Timothy M Speer
(74) *Attorney, Agent, or Firm*—Oblon, Spivak, McClelland, Maier & Neustadt, L.L.P.

(57) ABSTRACT

A body of single crystal CVD (chemical vapour deposition) diamond particularly suitable as a wear resistant material for wear applications, such as wire drawing dies, graphical tools or stichels, or fluid jet nozzles. The diamond typically has a low wear rate, exhibits a low birefringence indicative of low strain and possesses an ability to be processed to show a high surface polish.

22 Claims, 2 Drawing Sheets

FOREIGN PATENT DOCUMENTS

| | | |
|---|---|---|
| EP | 0 589 464 A1 | 3/1994 |
| EP | 0 615 954 A1 | 9/1994 |
| EP | 0 715 885 A2 | 6/1996 |
| EP | 0 752 288 | 1/1997 |
| JP | 1-131014 | 5/1989 |
| JP | 6-107494 | 4/1994 |
| JP | 6-263418 | 9/1994 |
| JP | 7-277890 | 10/1995 |
| JP | 08-066900 | 3/1996 |
| JP | 9-165295 | 6/1997 |
| JP | 11-1392 | 1/1999 |
| JP | 03-228504 A * | 10/1999 |
| WO | 01/96634 | 12/2001 |

OTHER PUBLICATIONS

English translation of "Characterization of thick homoepitaxial film on diamond (001) substrate II".

English translation of "Homoepitaxial growth of diamond (001) with nitrogen doping".

J. Michler, et al., J. Appl. Phys., vol. 83, No. 1, pp. 187-197, Jan. 1998.

R. Locher, et al., Appl. Phys. Lett., vol. 65, No. 1, pp. 34-36, Jul. 1994.

I.I. Vlasov, et al., Phys. Stat. Sol, vol. (a)181, No. 83, pp. 83-90 (2000).

P.E. Pehrsson, et al., Mat. Res. Soc. Symp, Proc., vol. 416, pp. 51-56 (1996).

* cited by examiner

CVD DIAMOND IN WEAR APPLICATIONS

BACKGROUND OF THE INVENTION

This invention relates to single crystal CVD (chemical vapour deposition) diamond for use as a wear surface, and in particular for use in wire drawing dies.

In this application, a 'wear surface' is any surface of a solid which is subject to a sliding or moving contact with another surface or fluid, where that surface is particularly suited to such application because of its low wear rate, and optionally in addition because of one or more of the following properties: a) low displacement of the surface under the loads associated with the application, b) low frictional forces generated at the surface, or c) resistance of the surface to adverse modification, such as degradation of an optical surface.

A wire drawing die comprises a body of hard material having a hole formed therethrough and mounted in a suitable support. Such a body is known as a wire drawing die blank. Wire having a diameter greater than the diameter of the hole is drawn through the hole thereby reducing its diameter. The internal surface of the die thus forms a wear surface. A variety of hard materials may be used for the body. One of the best materials known is diamond because of its hardness and wear resistance. Diamond which has been used in wire drawing dies includes natural diamond and HPHT synthetic diamond.

Two parameters are considered to be key in the application of a wire die. First and foremost is the overall wear rate. Second is any ovality or out of round variation, which arises due to asymmetric wear. In single crystal diamond typically the asymmetry of the wear is reduced by using {111} plates with the wire forming hole aligned with the <111> direction parallel to the plate normal (i.e. the wire aligned perpendicular to the plate major {111} faces), although in the production of wires with cross-sections which are not round, other orientations of plate and hole direction may be preferable.

The wear rate of diamond is very sensitive to the conditions under which it is measured. As described hereinafter, this can be rationalized in terms of the range of possible wear mechanisms which are thought to operate and which may vary in their contribution according to the conditions of the test. However, no definitive model exists at this time. For a specific set of conditions, the minimum wear rate so far obtained in diamond (and therefore the most beneficial as a wear surface) is generally accepted to be a fundamental property of the material, typified by the behaviour observed in high quality single crystal natural diamond. Poor availability and the high cost of suitable natural diamond has led to the development of a substantial market in HPHT synthetic single crystal diamond. Interest has been expressed in using CVD single crystal diamond, but this has not been commercially available to date.

Recently it has been disclosed that high quality CVD diamond of high purity can be made with advantageous electronic properties [International Patent Publication WO 01/96634]. That disclosure shows that by controlling the incorporation of impurities and lattice defects such as dislocations, it is not only possible to achieve the electronic performance of natural diamond, but to substantially exceed natural diamond in certain key electronic parameters. This was not predicted but has been rationalized retrospectively in terms of the effect such impurities and defects have on trapping charge carriers.

SUMMARY OF THE INVENTION

According to a first aspect of the invention, there is provided a body of single crystal diamond produced by CVD for use in a wear application, wherein the wear rate of a surface of the diamond, measured in the manner described below, is no greater than 0.11 µm/min, preferably no greater than 0.10 µm/min; more preferably no greater than 0.095 µm/min, and even more preferably no greater than 0.090 µm/min.

The body of single crystal diamond preferably has at least one of the characteristics (i) to (iii):

(i) Nitrogen present in the diamond as an impurity or dopant, resulting from incorporation during growth. The nitrogen will generally be present throughout the volume of the single crystal although the concentration may vary: benefit arises from its effect on the growth morphology and the resulting internal crystal structure and also possibly from its presence at the wear surface. The nitrogen at the wear surface, or in the bulk, or both, as measured using electron paramagnetic resonance (EPR) in the form of the single substitutional nitrogen centre $[N-C]^o$ is typically in a concentration range having a lower limit of $2 \times 10^{15}$ atoms/cm$^3$, preferably $1 \times 10^{16}$ atoms/cm$^3$, more preferably $2 \times 10^{16}$ atoms/cm$^3$ and even more preferably $5 \times 10^{16}$ atoms/cm$^3$, and an upper limit of $1 \times 10^{19}$ atoms/cm$^3$, preferably $3 \times 10^{18}$ atoms/cm$^3$, and more preferably $1 \times 10^{18}$ atoms/cm$^3$;

(ii) A wear surface, i.e. that part of the surface of the body intended to be used as a wear surface, which is formed from a single growth sector, which is preferably one of the {100}, the {113}, the {111} and the {110} growth sectors, and more preferably the {100}, growth sector;

(iii) The diamond body is preferably of "high crystalline quality". In this context "high crystalline quality" allows the presence of dopant boron atoms and nitrogen atoms and point and line defects such as those including vacancies, hydrogen and the like.

The single crystal CVD diamond body may also have one or more of the following characteristics over the majority of the wear surface, i.e. the surface which in application is used as the wear surface in contact with another moving component. The term "majority of the wear surface" as used herein represents at least 70%, preferably at least 85%, more preferably at least 95%, and even more preferably 100% of the surface of the wear surface:

a) Dopants, and in particular B, present from incorporation during growth. These dopants will generally be present throughout the volume of the single crystal diamond although the concentration may vary, but their benefit arises primarily from their presence at the wear surface. When present at the wear surface, the boron content is typically in a range which has a lower limit of $1 \times 10^{16}$ atoms/cm$^3$ preferably $5 \times 10^{17}$ atoms/cm$^3$ and more preferably $1 \times 10^{18}$ atoms/cm$^3$ and an upper limit of $1 \times 10^{20}$ atoms/cm$^3$, preferably $2 \times 10^{19}$ atoms/cm$^3$ and more preferably $5 \times 10^{19}$ atoms/cm$^3$.

b) A Raman line width over the majority of the wear, surface as measured at 300K of less than 5 cm$^{-1}$ FWHM (full width at half maximum height) and preferably less than 4 cm$^{-1}$ and more preferably less than 3 cm$^{-1}$, and even more preferably less than 2.5 cm$^{-1}$ under 514 nm Ar ion excitation.

c) Low optical birefringence, indicative of low strain such that in samples at least 0.4 mm thick, preferably at least 0.6 mm and more preferably at least 0.8 mm thick, measured over lateral dimensions of at least 1.0 mm×1.0 mm, and preferably at least 1.5 mm×1.5 mm, and more preferably at least 2.5 mm×2.5 mm, and even more preferably at least 4 mm×4 mm, the modulus of the sine of the phase shift, $|\sin \delta|$, as measured by a 'Deltascan' or similar instrument with similar resolution using radiation in the range 545-615 nm and preferably 589.6 nm does not exceed certain limits. Specifically, these limits are that the modulus of the sine of the phase shift, $|\sin \delta|$, for at least 95%, and more preferably for at least 98%, and more preferably for at least 99% and most preferably for 100% of the analysed area of the sample remains in first order (i.e. $\delta$ does not exceed $\pi/2$) and that $|\sin \delta|$ does not exceed 0.9, and preferably does not exceed 0.6, and more preferably does not exceed 0.4, and more preferably does not exceed 0.3, and more preferably does not exceed 0.2.

d) Low optical birefringence, indicative of low strain such that in samples of a specified thickness of at least 0.4 mm, preferably at least 0.6 mm and more preferably at least 0.8 mm, measured over a specified area of at least 1.0 mm×1.0 mm, and preferably at least 1.5 mm×1.5 mm, and more preferably at least 2.5 mm×2.5 mm, and even more preferably at least 4 mm×4 mm, the maximum value of $\Delta n_{[average]}$, the average value of the difference between the refractive index for light polarised parallel to the slow and fast axes averaged over the sample thickness, as measured by a 'Deltascan' or similar instrument with similar resolution using radiation in the range 545-615 nm and preferably 589.6 nm does not exceed certain limits. Specifically, these limits are that for at least 95%, and more preferably for at least 98%, and even more preferably for at least 99% and most preferably for 100% of the analysed area of the sample, the birefringence remains in first order (i.e. $\delta$ does not exceed $\pi/2$) and that $\Delta n_{[average]}$ does not exceed $1.5 \times 10^{-4}$, and preferably does not exceed $5 \times 10^{-5}$, and more preferably does not exceed $2 \times 10^{-5}$, and more preferably does not exceed $1 \times 10^{-5}$.

e) A capability of being processed to show a high surface polish over an area of at least 1.0 mm×1.0 mm, and preferably at least 1.5 mm×1.5 mm, and more preferably at least 2.5 mm×2.5 mm, and even more preferably at least 4 mm×4 mm, with a surface $R_a$ (arithmetic mean of the absolute deviation from the mean line through the profile) of less than 2 nm, and preferably of less than 1 nm, and more preferably of less than 0.6 nm, and even more preferably of less than 0.4 nm.

f) A mechanical design strength, obtained from measurements made using a single cantilever beam technique with individual sample dimensions of 5.0 mm by 3.0 mm by 0.17-0.35 mm (length by breadth by thickness), in which at least 70% and preferably at least 80%, and more preferably at least 90%, and even more preferably at least 95% of samples tested over a batch size of at least 8, and preferably at least 10, and more preferably at least 15, will only fail at strength values of at least 2.5 GPa, and preferably of at least 3.0 GPa, and more preferably of at least 3.5 GPa.

The single crystal CVD diamond body of the invention will generally be in layer form and may be free standing or form a layer or region of a larger diamond body or layer. That larger diamond body or layer may be single crystal or polycrystalline diamond produced by CVD or other synthesys method. That larger diamond layer or body may be doped with boron, nitrogen or other elements, or some combination of these.

According to another aspect of the invention there is provided a method of producing a layer of single crystal CVD diamond of the invention. This method includes the steps of providing a diamond substrate having a surface which is substantially free of crystal defects, providing a source gas, such source gas including suitable sources of boron, nitrogen or other dopants used, dissociating the source gas and allowing homoepitaxial diamond growth on the surface which is substantially free of crystal defects thereby producing a layer of single crystal diamond, preferably of the type described above. Essential to this method is that the diamond growth takes place on a diamond surface that is substantially free of crystal defects.

The method of the invention includes the use of controlled nitrogen, and optionally boron additions, to the source gas.

Following the method of the invention it has been found that it is possible to produce synthetic CVD single crystal diamond that is particularly suitable as a wear resistant material, and in particular for making a blank for a wire drawing die. The diamond so produced by this CVD method is single crystal and has a wear rate which is no greater than 0.11 µm/min, preferably no greater than 0.10 µm/min, more preferably no greater than 0.095 µm/min, and even more preferably no greater than 0.090 µm/min, when measured by the wear resistance test described hereinafter. The diamond preferably also has one or more of the other characteristics described above.

For the various applications of the material of the invention, the diamond layer or body may be used as such or it may be severed, by cutting for example, to produce two or more and generally a large number of smaller pieces or elements which will find use in one or more of the applications described above. The shape and size of the piece or element will be dictated by the application.

Further according to the invention, a wire drawing die comprises a blank which is characterised by being single crystal CVD diamond having a wear rate no greater than 0.11 µm/min, preferably no greater than 0.10 µm/min, more preferably no greater than 0.095 µm/min, and even more preferably no greater than 0.090 µm/min, when measured by the wear resistance test described hereinafter. The diamond preferably also has one or more of the other characteristics described above.

Preferably, the blank is a {111} plate having a hole formed through the plate in the <111> direction parallel to the plate normal. The blank can also be a {100} plate with the hole being formed in the <100> direction parallel to the plate normal.

The single crystal CVD diamond die blank may be mounted in a suitable support to create a wire drawing die. Such supports, and the manner in which the diamond blank is mounted therein, are well known in the art.

The following materials are shown
CVD—the novel diamond of this example
ND—natural diamond, selected for wire die applications
MCD—HPHT synthetic diamond, selected for wire die applications
<100>—{001} plate with the wire drawn along a normal <100>direction <111>—{111} plate with the wire drawn along a normal <111>direction.

Figure 2:
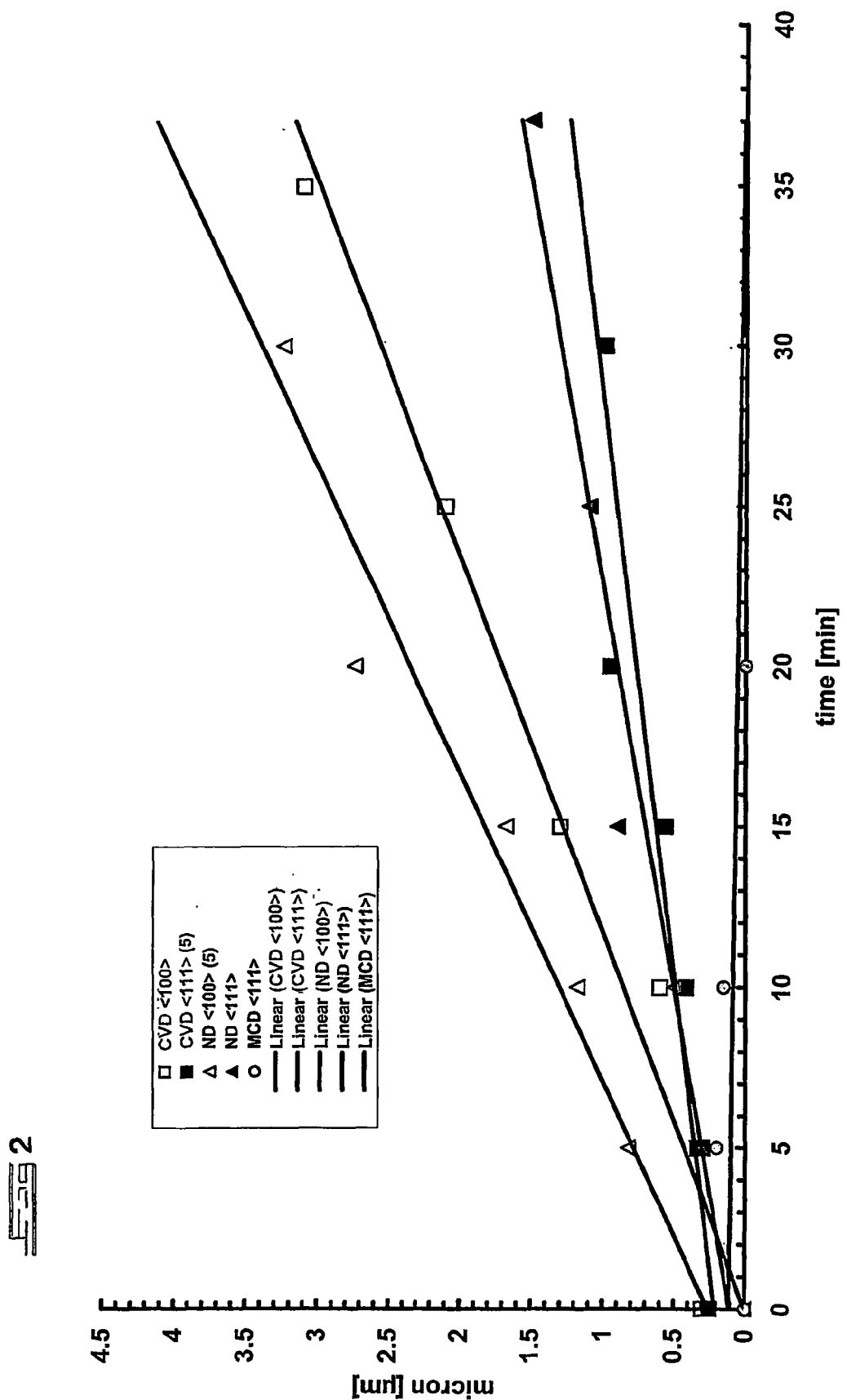

FIG. 2 shows the development of ovality for the aperture of the wire die. Each datapoint in these graphs represents the average of measurements on 5 dies. The following materials are shown CVD—the novel diamond of this example ND—natural diamond, selected for wire die applications MCD—HPHT synthetic diamond, selected for wire die applications <100>—{001} plate with the wire drawn along a normal <100>direction <111>—{111} plate with the wire drawn along a normal <111>direction.

DETAILED DESCRIPTION OF THE INVENTION

Wear mechanisms are still not well understood in many materials. This is particularly true of diamond. In diamond there are believed to be several key elements to a wear mechanism:

1) a chemical element associated with the interaction between the material with which the diamond is in contact. In particular, carbide formers such as steel wear diamond at an enhanced rate as the carbon of the diamond is graphitised or by other means absorbed or dissolved into the steel.
2) A plasma/chemical element, where a local plasma is generated at the point of sliding contact. Models include the formation of local electrical static charge due to the friction which causes the plasma to form, and once formed the interaction of the plasma and the diamond surface may be dependent on the gaseous environment.
3) A mechanical element, where small fragments of diamond are removed or broken off, such fragments being small on the scale of the typical geometry of the wear surface or component
4) Chipping, a further mechanical element where large fragments break off. Such large fragments can locally significantly alter the geometry of the wear surface or component and adversely affect its performance. In application it is desirable to avoid this mechanism.

In the light of these mechanisms for wear, and in particular with the apparent dominance of chemical wear mechanisms in diamond, it has generally been assumed that natural diamond represents the limit of the wear rate in diamond. There is no simple model to the contrary, nor has there been any reason to look for one. A more general understanding of deformation and wear in a range of materials would normally lead one to conclude that the presence of dislocations is beneficial in pinning the natural slip planes and hardening a material to deformation and wear and thus that by reducing dislocation densities wear rates would rise.

It is thus surprising that the present invention discloses a quality of diamond in which the wear rate is substantially lower than that of natural diamond, particularly when measured using steel wire which models suggest has a dominant chemical wear mechanism.

In the diamond of the invention, when it is free, or largely free from dopants, possible mechanisms reducing the wear rate include:

i) An enhanced local thermal diffusivity which will assist in reducing the temperature achieved by frictional heating.
ii) Low strain due to the very low dislocation density, reducing the susceptibility of the material to chemical wear processes.
iii) The formation of very smooth surfaces at the wear interface, due to the lack of crystal defects such as dislocations, which thus provide a more stable and less wearing surface.

The first of these mechanisms presumably does not operate in material where dopants are present, at least not to the same extent, and may not be very important as the thermal diffusivity falls significantly with temperature. However, in the presence of dopants further mechanisms may operate, relating to the manner in which dopants can change the charge state of a surface, and its electrical conductivity, thus affecting either the formation of the etching plasma or its effect on the diamond surface.

There are additional benefits to a diamond wear surface which has both a very low wear rate and which can be polished to a very smooth surface. In some applications it is advantageous to use diamond as only one of the wear surfaces, and another material for the other. The other material is invariably more prone to wear than the diamond, and the friction between the diamond and the other wear surface and the amount of wear which the other wear surface undergoes, can be substantially influenced by the detailed condition of the diamond surface. This type of effect can be particularly important in lubricated wear applications, such as those using oils, greases etc., where the wear on the non-diamond surface can be dominated by the surface roughness of the diamond.

In order to characterise the wear rate of the diamond, a set of test conditions were developed in a wire die application. The diamonds were processed into sinter-mounted wire drawing dies with a minimum hole diameter in the range 80 µm, specified to within ±0.15 µm diameter and with an ovality of less than 0.1 µm. The reduction angle was 10-12°. The machine used to draw the wire was a Heinrich HZ10 and was used to draw stainless steel wire DIN 1.4301, using wet drawing with a mineral oil coolant, with a drawing speed of 10 m/s, and a wire elongation of 18% resulting in a wire nominally 80 µm in diameter. The diameter and ovality of the wire was measured at the beginning of the test and at various times using a Zumbach ODAC 16J laser diameter measuring system and recorded. A minimum of five dies of any particular type/geometry should be tested, obtaining data at each wear time for each die and plotting an average value. The data obtained is the wire diameter and ovality, as measured from the wire exiting the die. The ovality is defined as the difference between the maximum chord diameter of the wire and the minimum chord diameter of the wire at the same position along the wire rotated by any angle relative to the maximum chord diameter.

A range of other possible characteristics of the diamond of the invention may be characterised as follows:

Birefringence

For an isotropic medium, such as stress-free diamond, the refractive index is independent of the direction of the polarization of light. If a diamond is inhomogeneously stressed, either because of grown-in stress or local defects or because of externally applied pressure, the refractive index is anisotropic. The variation of the refractive index with direction of polarization may be represented by a surface called the optical indicatrix that has the general form of an ellipsoid. The difference between any two ellipsoid axes is the linear birefringence for light directed along the third. This may be expressed as a function involving the refractive index of the unstressed material, the stress and opto-elastic coefficients.

The Deltascan (OxFord Cryosystems) gives information on how the refractive index at a given wavelength depends on polarization direction in the plane perpendicular to the viewing direction. An explanation of how the Deltascan works is given by A. M. Glazer et al. in Proc. R. Soc. Lond. A, 452 (1996), 2751-2765.

From a series of images captured for a range of different relative orientations of a pair of plane polarising filters the Deltascan determines the direction of the "slow axis", the polarization direction in the plane perpendicular to the viewing direction for which the refractive index is a maximum. It also measures $|\sin \delta|$ where $\delta$ is the phase shift given by $$\delta = (2\pi/\lambda) \Delta n\, L$$

where $\lambda$ is the wavelength of the light, L is the thickness of the specimen and $\Delta n$ is the difference between the refractive index for light polarized parallel to the slow and fast axes. $\Delta n$ L is known as the 'optical retardation'.

For retardation in first order, with L=0.6 mm and $\lambda$=589.6 nm, then: when $\sin \delta$=1 and $\Delta n$ L=$\lambda$/4, it can be deduced that $\Delta n$=2.45×10$^{-4}$; when $\sin \delta$=0.5 and $\Delta n$ L=$\lambda$/12, it can be deduced that $\Delta n$=0.819×10$^{-4}$.

The Deltascan produces three colour-coded images showing the spatial variations of a) the "slow axis", b) $\sin \delta$ and c) the absorbance at the wavelength of operation.

Samples are prepared as optical plates of known thickness and analysed over an area of at least 1.3 mm×1.3 mm, and preferably 2.5 mm×2.5 mm, and more preferably 4 mm×4 mm. Sets of Deltascan images or 'frames', each covering an area of 1 mm×0.75 mm, are recorded for each sample at a wavelength of 589.6 nm. Within each frame, the Deltascan individually analyses 640×480 pixels, ensuring the sample is analysed at very fine scale. The array of Deltascan $|\sin \delta|$ images is then analysed for the behaviour of sine $\delta$. The simplest analysis is to identify the maximum value of sine $\delta$ in each 1 mm×0.75 mm frame over the whole of the analysis area and use these values to characterise the maximum value of the whole of the area analysed. Where the array of 1 mm×0.75 mm frames does not exactly match the area under analysis, the frames are arranged to obtain the minimum total number of frames to entirely cover the area, and centred so as to make utilisation of edge frames as symmetric as practical. That part of the data in any frame which is from outside the boundary of the area under analysis is then excluded from the analysis of that frame. Alternatively, each 1 mm×0.75 mm frame can be analysed for the maximum value remaining after exclusion of 5%, 2%, 1%, or none of the data within it that lies within the analysed sample area, so as to obtain the maximum value over 95%, 98%, 100% respectively of the material in the area analysed.

The behaviour of sine $\delta$ is the property of a particular plate of material, constrained here to plates of useful thickness by application of a minimum thickness. A more fundamental property of the material can be obtained by converting the sine $\delta$ information back to a value averaged over the thickness of the sample of the difference between the refractive index for light polarised parallel to the slow and fast axes, $\Delta n_{[average]}$.

Surface $R_a$

Surface roughness was measured using a Zygo NewView 5000 scanning white light interferometer. The interferometer utilises a microscope equipped with an interferometric objective of the Michelson or the Mireau type. Magnifications of between 1× to 50× are possible with this system. By measuring over the full area of the diamond plate we found that surface roughness varied by less than 10% over the area of the plate if it was fully fine-polished. Therefore, in the current measurements, the roughness was inferred from measurement over a representative area of approx. 0.36 mm×0.27 mm.

Mechanical Strength

The utility of the diamond of this invention is clearly illustrated by the absence of reported strength data in single crystal diamond which has been obtained by actual fracture tests. Data currently reported is based on indentation tests, and the approximations and assumptions which are inherent in this approach. Conversely, the method of this invention makes material available in sufficient quantity that proper fracture tests can be completed.

Furthermore, fracture strength testing is a destructive test. Since each piece of natural diamond is unique, once its strength is known then it is no longer available for application. Fracture testing can then only be used to characterise the spread of strength against some proxy characteristic requiring non-destructive testing, and the lowest anticipated strength used for design of pieces of material for the application. In contrast, the synthetic diamond of the invention is a well characterised and consistent material such that the fracture strength of a particular element can be reasonably predicted based on fracture statistics of equivalent samples. The design strength of diamond, as used in this specification, is the strength which is exhibited by at least 70%, preferably 80%, more preferably at least 90%, and even more preferably at least 95% of equivalent samples of material tested using the procedure below.

The strength was measured using a single cantilever beam technique, with a sample size of 5.0 mm by 3.0 mm by 0.18-0.35 mm (length, l, by breadth, b, by thickness, d). The samples were cut from {100} oriented plates, with the long axis along the <110> direction (so that the thickness is along the <100> and the length and breadth are along the <110>). The testing procedure mounted the beams with an exposed length of 4 mm (i.e. 1 mm inside the clamp) and applied the force at a distance of 3.5 mm from the clamp.

The strength, $\sigma_b$, is given by the expression:

$$\sigma_b = (6 Ws)/(bd^2)$$

where W is the breaking load and s is the distance between the loading line and the clamping line.

Test samples were cut from homoepitaxial CVD diamond plates and carefully prepared by scaife polishing on progressively finer and finer grits down to a grit size of approximately 0.1 μm. Poor surface finish can limit the measured strength of the material and the ability of this material to take a high surface finish may contribute to its overall strength.

The CVD diamond material of the invention is produced by a CVD method, in the presence of controlled levels of nitrogen, and optionally in the presence of controlled levels of other dopants and in particular boron. The level of nitrogen utilised is critical in controlling the development of crystal defects and thus achieving a diamond material having the key characteristics of the invention. It has been found that material grown with very high levels of nitrogen can show a degraded crystal quality. Conversely, material grown under conditions with essentially no nitrogen, or less than 300 ppb of nitrogen has a comparatively higher level of local strain generating defects, which may affect properties such as the strain in the diamond. The exact mechanism of this is not well understood, but the following observations have been made. In what follows the word 'dislocations' is intended to cover both isolated dislocations and dislocation bundles where dislocations are grouped together.

No diamond material can be made entirely free of dislocations and other crystal defects over large volumes. The sensitivity of different properties to such crystal defects varies. Local strain fields appear to be sensitive to dislocations.

In the absence of sufficient nitrogen in the gas mixture of the growth process, pits form on the {100} growth surface around dislocations which pre-exist in the substrate material or are generated at the substrate/growth interface. Whether because of these pits or otherwise, dislocations can slowly multiply during growth. To a certain extent this process is exponential, with the rate of dislocation multiplication dependent on the existing local dislocation density and arrangement.

In the presence of small amounts of nitrogen, relative facet growth rates are changed and these pits can be removed. Whether because of the absence of these pits or otherwise, dislocation multiplication can be reduced or totally avoided.

These pits may also be responsible for the inclusion of other defects and impurities in the material in a non-uniform manner.

The lower bound to the preferred concentration of N in the process gas is thus set by the need to limit pitting and control the strain generating defects, and the upper bound to the concentration of nitrogen in the process gas set by the onset of deleterious crystal degradation.

Using the above conditions it has been possible to produce the single crystal CVD diamond material of the invention, typically in layer form, with advantageous wear properties.

It is important for the production of a wear resistant diamond layer of the invention that growth of a layer of single crystal CVD diamond takes place on a diamond surface which is substantially free of crystal defects. In this context, defects primarily mean dislocations and micro cracks, but also include twin boundaries, point defects not intrinsically associated with the dopant N atoms, low angle boundaries and any other extended disruption to the crystal lattice. Preferably the substrate is a low birefringence type Ia natural, Ib or IIa high pressure/high temperature synthetic diamond or a CVD synthesised single crystal diamond.

The quality of growth on a substrate which is not substantially free of defects rapidly degrades as the layer grows thicker and the defect structures multiply, causing general crystal degradation, twinning and renucleation.

The defect density is most easily characterised by optical evaluation after using a plasma or chemical etch optimised to reveal the defects (referred to as a revealing plasma etch), using for example a brief plasma etch of the type described below. Two types of defects can be revealed:

1) Those intrinsic to the substrate material quality. In selected natural diamond the density of these defects can be as low as $50/mm^2$ with more typical values being $10^2/mm^2$, whilst in others it can be $10^6/mm^2$ or greater.

2) Those resulting from polishing, including dislocation structures and microcracks forming chatter tracks along polishing lines. The density of these can vary considerably over a sample, with typical values ranging from about $10^2/mm^2$, up to more than $10^4/mm^2$ in poorly polished regions or samples.

The preferred low density of defects is such that the density of surface etch features related to defects, as described above, are below $5 \times 10^3/mm^2$, and more preferably below $10^2/mm^2$.

The defect level at and below the substrate surface on which the CVD growth takes place may thus be minimised by careful preparation of the substrate. Included here under preparation is any process applied to the material from mine recovery (in the case of natural diamond) or synthesis (in the case of synthetic material) as each stage can influence the defect density within the material at the plane which will ultimately form the substrate surface when preparation as a substrate is complete. Particular processing steps may include conventional diamond processes such as mechanical sawing, lapping and polishing (in this application specifically optimised for low defect levels), and less conventional techniques such as laser processing or ion implantation and lift-off techniques, chemical/mechanical polishing, and both liquid chemical processing and plasma processing techniques. In addition, the surface $R_Q$ (measured by stylus profilometer, preferably measured over 0.08 mm length) should be minimised, typical values prior to any plasma etch being no more than a few nanometers, i.e. less than 10 nanometers. $R_Q$ is the root mean square deviation of surface profile from flat (for a Gaussian distribution of surface heights, $R_Q=1.25\ R_a$: for definitions, see for example "Tribology: Friction and Wear of Engineering Materials", I M Hutchings, (1992), Publ. Edward Arnold, ISBN 0-340-56184).

One specific method of minimising the surface damage of the substrate is to include an in situ plasma etch on the surface on which the homoepitaxial diamond growth is to occur. In principle this etch need not be in situ, nor immediately prior to the growth process, but the greatest benefit is achieved if it is in situ, because it avoids any risk of further physical damage or chemical contamination. An in situ etch is also generally most convenient when the growth process is also plasma based. The plasma etch can use similar conditions to the deposition or diamond growing process, but with the absence of any carbon containing source gas and generally at a slightly lower temperature to give better control of the etch rate. For example, it can consist of one or more of (i) an oxygen etch using predominantly hydrogen with optionally a small amount of Ar and a required small amount of $O_2$. Typical oxygen etch conditions are pressures of $50\text{-}450 \times 10^2$ Pa, an etching gas containing an oxygen content of 1 to 4 percent, an argon content of 0 to 30 percent and the balance hydrogen, all percentages being by volume, with a substrate temperature 600-1100° C. (more typically 800° C.) and a typical duration of 3-60 minutes.

(ii) a hydrogen etch which is similar to (i) but where the oxygen is absent.

(iii) alternative methods for the etch not solely based on argon, hydrogen and oxygen may be used, for example, those utilising halogens, other inert gases or nitrogen.

Typically the etch consists of an oxygen etch followed by a hydrogen etch and then moving directly into synthesis by the introduction of the carbon source gas. The etch time/temperature is selected to enable remaining surface damage from processing to be removed, and for any surface contaminants to be removed, but without forming a highly roughened surface and without etching extensively along extended defects such as dislocations which intersect the surface and thus cause deep pits. As the etch is aggressive, it is particularly important for this stage that the chamber design and material selection for its components be such that no material is transferred by the plasma from the chamber into the gas phase or to the substrate surface. The hydrogen etch following the oxygen etch is less specific to crystal defects rounding off the angularities caused by the oxygen etch which aggressively attacks such defects and providing a smoother, better surface for subsequent growth.

The primary surface of the diamond substrate on which the CVD diamond growth occurs is preferably the {100} surface. Due to processing constraints, the actual sample surface orientation can differ from this ideal orientation up to 5°, and in some cases up to 10°, although this is less desirable as it adversely affects reproducibility.

It is also important in the method of the invention that the impurity content of the environment in which the CVD growth takes place is properly controlled. More particularly, the diamond growth must take place in the presence of an atmosphere containing substantially no contaminants other than the intentionally added nitrogen or other dopants used. The addition of nitrogen should be accurately controlled, with an error of less than 300 parts per billion (as a molecular fraction of the total gas volume) or 10% of the target value in the gas phase, whichever is the larger, and preferably with an error of less than 200 parts per billion (as a molecular fraction of the total gas volume) or 6% of the target value in the gas phase, whichever is the larger, and more preferably with an error of less than 100 parts per billion (as a molecular fraction of the total gas volume) or 3% of the target value in the gas phase, and even more preferably with an error of less than 50 parts per billion (as a molecular fraction of the total gas volume) or 2% of the target value in the gas phase, whichever is the larger. Measurement of absolute and relative nitrogen concentration in the gas phase, particularly at concentrations in the range 300 ppb-5 ppm requires sophisticated monitoring equipment such as that which can be achieved, for example, by gas chromatography as described in WO 01/96634.

The source gas may be any known in the art and will contain a carbon-containing material which dissociates producing radicals or other reactive species. The gas mixture will also generally contain gases suitable to provide hydrogen or a halogen in atomic form, and a source of nitrogen which may be for example $N_2$ or $NH_3$, and optionally a source of boron.

The dissociation of the source gas is preferably carried out using microwave energy in a reactor, examples of which are known in the art. However, the transfer of any impurities from the reactor should be minimised. A microwave system may be used to ensure that the plasma is placed away from all surfaces except the substrate surface on which diamond growth is to occur and its mount (the 'substrate carrier'). Examples of preferred mount materials include molybdenum, tungsten, silicon and silicon carbide. Examples of preferred reactor chamber materials include stainless steel, aluminium, copper, gold and platinum.

A high plasma power density should be used, resulting from high microwave power (typically 3-60 kW, for substrate diameters of 25-300 mm) and high gas pressures (50-500× $10^2$ Pa, and preferably 100-450×$10^2$ Pa).

A key element to the method of the invention is that it allows synthesis of the material of suitable quality in thick layers. As the preferred growth sector is {100}, but the preferred wire drawing die blank is {111}, then the wire die blank is preferably cut at an angle to the original diamond substrate. In order to do this, a minimum CVD layer thickness, dependent on the die blank dimensions, is typically 2-3 mm, but the efficiency of utilizing the volume of material produced rises rapidly for thicker layers, for example 4-6 mm thick.

Applications arising from the CVD diamond material of the invention, where performance is enabled by these unique material properties, include but are not limited to:

wire drawing dies, particularly for use with carbide forming metals where a chemical wear mechanism is generally believed to be significant Such metals include steel wires, particularly those containing Ni and Cr, but such wires are required to be drawn commercially in large quantities and thus suitable dies with low wear rates are needed.

bearing surfaces requiring a very low coefficient of friction, or adherence over time to tight mechanical tolerances. Such surfaces often provide the positional stability of the moving component, required for the correct function of the system.

wear surfaces such as those found in valves, orifices and optical analysis windows on fluid control systems handling abrasive fluids or fluids containing suspended particulates.

A particular characteristic of the diamond of the invention, which has unexpected benefit, is the low stress in the material as characterized by low birefringence. Material with low birefringence has been shown to exhibit very low wear rates making it suitable for applications where birefringence may not normally be considered a limiting factor. For example, in addition to the wear of wire dies, characterized by the increasing hole size and out of roundness, low birefringence results in a low wear rate of stichels (diamond graphical tools), water jet nozzles, and slower degradation of the optical performance of analysis windows in contact with abrasive fluid flow.

Likewise, the ability to take a polish with low surface roughness is also indicative of the low stress. Thus material which can be polished to a very low surface roughness has been shown to have unexpectedly good wear properties in a range of applications, in addition to the benefit a high surface polish may bring to the applications, at least initially before the surface condition is determined by the wear process.

Work has shown that annealing the diamond can additionally enhance the wear rate of the diamond and its useful application to wear and cutting applications. This benefit is particularly seen in material grown by the method of this invention, which in the as grown condition already has relatively low wear. By annealing is meant any process in which elevated temperature is used in a controlled manner to bring about a beneficial modification to any of the properties of diamond, either to those properties detailed in this specification or to properties which in application are complementary to those properties. The heat treatment will vary according to the nature of the as-grown CVD diamond and the desired changes to be produced. Annealing processes presumably further reduce local points of strain in the diamond as well as modifying regions of non-diamond structure. Annealing may be near atmospheric pressure or at high pressure and typically takes place in the temperature range above 1200° C. and more typically above 1700° C. An upper limit on the annealing temperature range of 2500° C.-2800° C. is set by the limitation of current experimental capabilities although benefit is anticipated from higher temperatures.

The process of wire drawing is to draw a wire of bigger diameter through a hole with a smaller diameter, thereby reducing the wire diameter through plastic deformation while the material volume remains the same. Typically a wire of a specific diameter is produced by drawing the starting material in the form of a cylinder or a roll of wire through a set of successively smaller diameter drawing dies. Examples of materials that are drawn include steel and steel alloys, copper and copper alloys, gold, and tungsten. Tool wear is the major cause for interruption of the manufacturing process. Typical materials used for wire drawing dies are tungsten carbide, sintered polycrystalline diamond typically with a cobolt binder phase, natural diamond, and HPHT monocrystalline diamond. Material selection criteria for HPHT monocrystalline diamond are orientation, colour, flaws and internal stress. Improved wear resistance would constitute an important improvement in productivity for a wire drawing manufacturer. CVD diamond prepared according to the method of this invention shows superior low stress as measured by the optical birefringence of the diamond plates and has in addition no flaws or other defects such as inclusions. As a consequence its wear has been shown to be reduced substantially, and the life time of wire dies made from this material has been extended by in the range of 25% to more than 40% over the lifetime of existing materials such as type Ia 'Cape' diamond.

Diamond graphical tools or stichels are used in the printing industry to engrave copper cylinders with a pattern of diamond shaped indentations, which serve to hold the ink during printing. The depth and shape of these indentations must be accurately controlled since they control the amount of ink that is transferred to the paper. Wear in the shaped diamond tip will affect the quality of the printing result. Since wear properties of diamond are affected by diamond composition, crystal imperfections and internal stress it is in particular advantageous to use single crystal CVD diamond as prepared by the method of this invention. When using natural diamond of type IIa in this application the large stresses in the material give rise to early failure. Typically this is partly caused by wear but also often by catastrophic failure due to breakage. The latter is attributed to the large internal stresses typical for type IIa diamond. In prior art the preferred material is generally natural diamond type Ia which has much lower stresses than natural diamond type IIa. However, in type Ia diamond internal stress also plays an important role in wear and failure. Relatively high stress 'brown' coloured graphical tools have an average lifetime which is inferior to the more costly yellow coloured ('cape') tools.

In water jet cutting a nozzle is applied to produce a water jet to cut different materials, ranging from food to ceramic tiles. Generally a sapphire nozzle is used. This nozzle has a lifetime of 50 hours, while normal Ia diamond nozzles have a lifetime of 500 to 800 hours. The lifetime is determined by the wear of the hole; when the hole becomes too large or loses its round profile the quality of the cut becomes unsatisfactory. The advantage of a diamond nozzle is that the user experiences less down time, less material loss and better products. Diamond nozzles made from the single crystal CVD diamond of this invention are currently under development. These CVD diamond nozzles show lower wear rates, maintaining a suitable size and profile of cut for longer and reducing the downtime for nozzle replacement. A further advantage is the repeatable nature of the material, providing more consistent behaviour in use, assisting in preparation of the nozzle, enabling more design possibilities, and removing steps of material selection necessary with natural diamond.

Diamond turning tools are widely used for the machining of highly accurately shaped parts made from different materials such as non-ferrous metals, industrial ceramics, plastics and glass. Typically the tip of the tool is used for turning or milling parts with very low roughness and high form accuracy. For instance in the metal turning industry flat, spherical and aspheric metal mirrors are produced for high power laser applications, and polygons for scanning applications and similar high surface quality optical elements. Similarly in the glass and plastics industry spherical and non-spherical lenses can be produced for applications such as contact lenses, compact disc readout systems, spectacles etc. In general in the machine building industry highly accurate non-ferrous metal parts are produced by diamond tip turning or milling e.g. aluminum parts in the automotive industry. A key benefit of diamond generally in these applications is that the diamond cutting produces the final surface finish, avoiding time consuming multi-step processes.

Wear in the tools ultimately determines quality and lifetime of the products made with these tools. Typically brown and yellow ('Cape') coloured type Ia natural diamonds are used for these tools. However single-crystal CVD diamond made according to the method of this invention has reduced wear and breakage as compared to natural diamond tools, and produces a more consistent high surface finish for longer.

In some applications a further benefit can be derived by taking account of the predominant dislocation direction in the material. The dislocations formed in CVD diamond generally form parallel or near parallel to the growth direction, that is the direction normal to the growth facet which the dislocation intersects. It is then possible to prepare the wear surface such that the dislocations in the material are predominantly parallel or perpendicular to the wear surface, and where the dislocations are parallel or have a parallel component it is further possible to select the direction of motion on the wear surface relative to that parallel component of the direction of the dislocations. Benefit arises from the mechanism by which the wear process interacts with the dislocations and the particular geometry of the bearing surface. For example dislocations perpendicular to a wear surface have a continual point of weakness to follow into the crystal, whereas parallel dislocations would result in a point of weakness rapidly moving across the wear surface, possibly to its edge.

For the purposes of this specification the characteristic direction of the dislocations within a particular growth sector is the mean direction of the dislocations using a vector average, and with at least 70%, more typically 80%, and even more typically 90% of the dislocations lying in a direction which is within 20°, more preferably 15°, even more preferably 10° and most preferably 5° of the mean direction.

The characteristic dislocation direction can be determined for example by X-ray topography. Such methods do not necessarily resolve individual dislocations but may resolve dislocation bundles, generally with an intensity in part proportional to the number of dislocations in the bundle. Simple or preferably intensity weighted vector averaging is then possible from topographs imaging cross sections in the plane of the dislocation direction, with a topograph taken normal to that direction being distinct in having a pattern of points rather than lines. Where the original growth direction of a plate is known, then this is a sensible starting point from which to determine the dislocation direction.

Having determined the characteristic dislocation direction according to the above method, its orientation can be classified relative to the wear face or faces of the single crystal CVD diamond plate. The direction of the dislocations is considered to be oriented away from normal or perpendicular to a wear surface of the diamond plate if the angle between the dislocation direction and the normal or perpendicular line drawn from the wear surface is more than 30°, preferably more than 40°, and more preferably more than 50°.

The above descriptions of the use of the diamond of the invention are by way of examples of the wide range of use of the material of this invention, and those skilled in the art will recognise the general importance of the wear properties of the CVD diamond material of this invention to other applications in addition to those indicated above.

The invention will now be discussed in further detail by way of the following non-limiting examples.

EXAMPLE 1

Substrates suitable for synthesising single crystal CVD diamond of the invention may be prepared as follows:

i) Selection of stock material (type Ia natural stones and type Ib HPHT stones) was optimised on the basis of microscopic investigation and birefringence imaging to identify substrates which were free of strain and imperfections.

ii) Laser sawing, lapping and polishing to minimise subsurface defects using a method of a revealing plasma etch to determine the defect levels being introduced by the processing.

iii) After optimisation it was possible routinely to produce substrates in which the density of defects measurable after a revealing etch is dependent primarily on the material quality and is below $5\times10^3/mm^2$, and generally below $10^2/mm^2$. Substrates prepared by this process are then used for the subsequent synthesis.

A high temperature/high pressure synthetic type 1b diamond was grown in a high pressure press, and as a substrate using the method described above to minimise substrate defects to form a polished plate 5 mm×5 mm square by 500 µm thick, with all faces {100}. The surface roughness $R_Q$ at this stage was less than 1 nm. The substrate was mounted on a tungsten substrate carrier using a high temperature diamond braze. This was introduced into a reactor and an etch and growth cycle commenced as described above, and more particularly:

1) The 2.45 GHz reactor was pre-fitted with point of use purifiers, reducing unintentional contaminant species in the incoming gas stream to below 80 ppb.
2) An in situ oxygen plasma etch was performed using 15/75/600 sccm (standard cubic centimetre per second) of $O_2/Ar/H_2$ at $263\times10^2$ Pa and a substrate temperature of 730° C.
3) This moved without interruption into a hydrogen etch with the removal of the $O_2$ from the gas flow.
4) This moved into the growth process by the addition of the carbon source (in this case $CH_4$) and dopant gases. In this instance was $CH_4$ flowing at 36 sccm and 1 ppm $N_2$ was present in the process gas, provided from a calibrated source of 100 ppm $N_2$ in $H_2$ to simplify control. The substrate temperature at this stage was 800° C.
5) On completion of the growth period, the substrate was removed from the reactor and the CVD diamond layer removed from the substrate.

The CVD diamond layer grown above can be sufficiently large to produce at least one and preferably several wire drawing dies depending on the size of the CVD diamond layer and the required size of the wire dies.

A CVD diamond layer grown as described above was 5.6 mm×5.6 mm×3.0 mm after release from the diamond substrate and was cleaved into {111} plates with a thickness of 0.6 mm as desired for use as a diamond die blank.

In addition, wire die blanks were similarly prepared from HPHT and natural diamond which was carefully selected for its known high performance as a wire die.

Dies where prepared from these die blanks, according to the details of the test method described earlier, with both <100> and <111> drawing directions, out of plates with a {100} and {111} orientation respectively.

The dies were used to draw wire, as described in the earlier test method, and the wear data obtained were analysed to show both average diameter growth (FIG. 1) and the development of ovality (FIG. 2) for the aperture of the wire die. Each datapoint in these graphs represents the average of measurements on 5 dies.

The following materials are shown in the two figures:
CVD—the novel diamond of this example
ND—natural diamond, selected for wire die applications
MCD—HPHT synthetic diamond, selected for wire die applications <100>—{001} plate with the wire drawn along a normal <100> direction
<111>—{111} plate with the wire drawn along a normal <111> direction Thus CVD <100> refers to the novel CVD diamond material of this example tested as a {001} plate with the wire drawn along a normal <100> direction.

Figure 1:
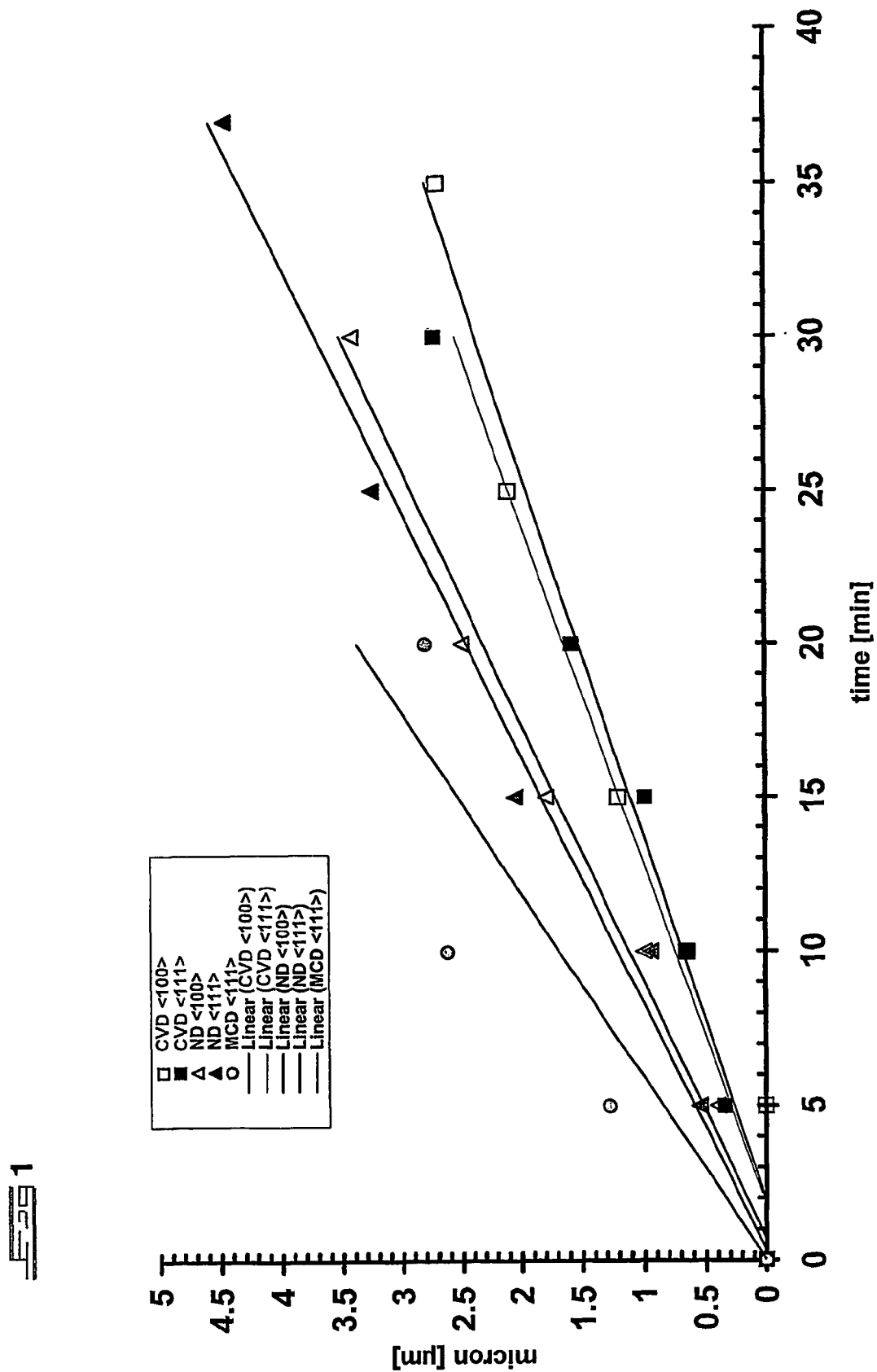
FIG. 1 shows the average diameter growth for the aperture of the wire dire described in the Examples. Each datapoint represents the average of measurements on 5 dies.

From the data shown in FIG. 1 the following conclusions can be drawn about the average growth rate of the die hole diameter.

a) The average growth rate of the die hole diameter shows good linear behaviour with time in both the natural diamond and the CVD diamond of the invention.
b) The average growth rate of the die hole diameter is similar for both the <111> and <100> wire directions in the CVD diamond, and similarly in the natural diamond.
c) The average growth rate of the die hole diameter for both <111> and <100> wire directions is substantially lower in the CVD diamond of the invention than the similar figures for the natural diamond.
d) In particular, the wear rate defined as the gradient of the least squares straight line fit to the data obtained on the average growthrate of the die hole diameter, for the various materials and configurations tested, was found to be as follows:

| Material | Orientation | Wear rate (µm/min) |
|---|---|---|
| HPHT | <111> | 0.137 |
| Natural | <111> | 0.125 |
|  | <100> | 0.112 |
| CVD diamond of the invention | <111> | 0.090 |
|  | <100> | 0.084 |

From the data shown in FIG. 2 the following conclusions can be drawn about the development of ovality in the die hole diameter.

a) The rate of development of ovality for the <111> direction was similar in the natural and CVD diamond. This suggests that the mechanisms of wear are similar in the two materials, although clearly the overall rate of wear is significantly different between them.
b) Likewise, the rate of development of ovality for the <100> direction was similar in the natural and CVD diamond, although significantly higher than that for the <111> direction in accordance with prior art. This again suggests that the mechanisms of wear are similar in the two materials, although the overall rate of wear is significantly different between them.

EXAMPLE 2

A plate of homoepitaxial CVD diamond was synthesised according to the method described in Example 1.

The plate was then fine polished one side on a cast iron diamond polishing wheel that had been carefully prepared. The tang used was very rigid and held the diamond against a reference surface that ran parallel to the scaife surface. The diamond plate was then turned over and the other side was polished to the desired flatness and parallelism on the same scaife.

The plate was then measured for surface $R_a$ using the Zygo NewView 5000 scanning white light interferometer. Measurements were taken each side of the sample, each measurement on a 1 mm×1 mm area with the 9 areas forming a 3 mm×3 mm grid on the centre of each side, and then the statistical mean of the 9 measurements was calculated. The measured $R_a$ on side A was 0.53 nm±0.04 nm, and on side B was 0.54 nm±0.05 nm.

EXAMPLE 3

A set of 6 mm×6 mm×0.4 mm plates of homoepitaxial CVD diamond were synthesised according to the method described in Example 1. From these plates, a set of rectangular test samples, 3 mm×5 mm in lateral dimensions and 0.17 to 0.22 mm thick were cut, ensuring that the cut pieces were free from growth sector boundaries.

The set of samples was polished on a scaife using a range of diamond powders down to 0.1 μm. Care was taken to ensure that, as far as possible, all sub-surface damage was removed from the samples. The final polishing stage with the finest grit is vital as this controls the final surface flaw size distribution. After the top and bottom surfaces were polished, the edges of the samples were prepared to the same standard. After polishing was complete, the surfaces were examined by Nomarski interference contrast and 'micromapped' to check the surface roughness. Nomarski microscopy at a magnification of ×200 revealed that there where no visible defects in the surface. The surface roughness, as defined by the $R_a$ value, was determined using a non-contact, optical surface roughness measurement instrument ('Micromap'). Two series of 200 μm long scans were made in perpendicular directions and the resulting $R_a$ values were averaged yielding a mean $R_a$ value of less than 0.25 nm. This compares with typical $R_a$ values of between 1 nm and 5 nm for diamonds polished using the same technique as is used for polishing natural diamonds in the jewellery trade.

An additional stage of ion beam etching was applied to the surface of some of the samples prior to final polishing. A further optional technique would be to chemically thin the samples prior to final polishing.

The strength of the plates was measured by single cantilever beam bending. The individual strength values for a set of nine samples approximately 0.2 mm thick were, in GPa, 1.50, 1.63, 2.50, 3.26, 3.30, 4.15, 4.29, 4.83, 5.12. Analysis of this and other datasets suggests that the two lowest values are from a different population to the other seven, possibly indicating that the sample preparation was not sufficiently careful in this instance to avoid any influence on the measured strength. Even with these two suspect datapoints included, 77% of samples have a breaking strength of at least 2.5 GPa, and the data suggests the strength is actually in excess of 3 GPa.

For comparison, there being no equivalent data in the public domain (all known strength measurements on natural diamond are based on indentation testing, which is an indirect and less reliable method, because of the restricted availability of suitable samples), the strength of a batch of five type IIa natural diamond plates was also measured. These plates were carefully selected by examination with an optical microscope at ×50 magnification to be free of inclusions and other flaws which may weaken the diamond, and were prepared and tested by the same technique. The individual strength values for this set of 5 samples approximately 0.18 mm thick were, in GPa, 1.98, 2.08, 2.23, 2.61, 2.94 clearly limited by the intrinsic properties of the material. Similarly type Ib single crystal diamond synthesised by a high pressure-high temperature process were carefully selected, processed, and tested using the same techniques. The individual strength values for this set of 14 samples approximately 0.35 mm thick were, in GPa, 0.94, 1.11, 1.16, 1.3, 1.35, 1.38, 1.46, 1.50, 1.54, 1.6, 1.65, 1.72, 1.73, 1.98, 2.17.

The strength population of the CVD diamond of this invention is clearly distinct and higher than other forms of diamond.

A particular application of high strength diamond with low wear rate is in optical windows for fluid analysis, where the fluid under analysis can cause wear or degradation of the window. A particular window, which is 7 mm in diameter, has a clear aperture of 5 mm and is brazed around the outer 1 mm of one flat surface, has to withstand a pressure differential of 200 atmosphere with a safety factor of 4.

The breaking strength is related to the thickness, t, by:

$$t = \sqrt{(3r^2 Pk/8\sigma_b)}$$

where r is the clear aperture, P, the pressure, $\sigma_b$, the breaking strength and k a constraint factor which, for diamond, is 3.1 for unconstrained at the edge and 1.1 for fully constrained at the edge (assuming Poissons ratio for diamond to have a value of 0.1). Because determining the degree of constraint is difficult, we take the worst-case scenario of the edge being unconstrained.

If a natural diamond window (design strength 2.0 GPa) were used in this application, the thickness would need to be 0.54 mm. With strong single crystal CVD diamond of the invention (design strength 3.0 GPa), the thickness could be reduced to 0.44 mm. The reduction in the thickness of the material will reduce the cost of the window.

EXAMPLE 4

A set of 3 plates of homoepitaxial CVD diamond were synthesised according to the method described in Example 1. These were prepared as optical plates of thickness 0.60-0.64 mm and with lateral dimensions of up to 6 mm×6 mm. Sets of Deltascan images, each covering an area of 1 mm×0.75 mm, were recorded for each sample at a wavelength of 589.6 nm. Each Deltascan sine δ image was analysed for the maximum values of |sin δ| and the values of obtained are shown in the |sin δ| maps below.

Deltascan map of sample E4.1, showing the maximum value of |sin δ| in each frame of 1 mm×0.75 mm

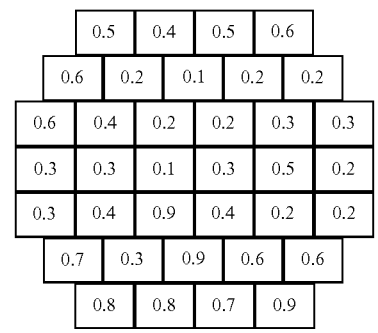

Analysis of the data above shows the following over an area of 2.0 mm×2.25 mm the maximum value for |sin δ| is 0.3 over an area of 3.0 mm×4.0 mm the maximum value for |sin δ| is 0.6 over an area of 5.25 mm×4.0 mm the maximum value for |sin δ| is 0.9

Deltascan map of sample E4.2, showing the maximum value of |sin δ| in each frame of 1 mm×0.75 mm

|     | 0.4 | 0.5 | 0.7 |     |     |
| --- | --- | --- | --- | --- | --- |
| 0.8 | 0.6 | 0.2 | 0.3 | 0.4 | 0.4 |
| 0.9 | 0.6 | 0.3 | 0.3 | 0.4 | 0.5 |
| 0.6 | 0.3 | 0.3 | 0.3 | 0.4 | 0.6 |
| 0.4 | 0.3 | 0.3 | 0.3 | 0.2 | 0.5 |
| 0.7 | 0.3 | 0.2 | 0.2 | 0.2 | 0.7 |
|     | 0.8 | 0.5 | 0.2 | 0.2 | 0.3 |

Analysis of the data above shows the following over an area of 2.0 mm×3.75 mm the maximum value for $|\sin \delta|$ is 0.3 over an area of 3.0 mm×3.75 mm the maximum value for $|\sin \delta|$ is 0.4 over an area of 4.0 mm×4.5 mm the maximum value for $|\sin \delta|$ is 0.7

Deltascan map of sample E4.3, showing the maximum value of $|\sin \delta|$ in each frame of 1 mm×0.75 mm

|     | 0.4 | 0.6 | 0.9 |     |     |
| --- | --- | --- | --- | --- | --- |
| 0.9 | 0.5 | 0.6 | 0.9 | 0.8 |     |
| 0.9 | 0.4 | 0.2 | 0.5 | 0.9 |     |
| 0.3 | 0.2 | 0.2 | 0.1 | 0.5 | 0.5 |
| 0.4 | 0.2 | 0.2 | 0.1 | 0.6 | 0.5 |
| 0.4 | 0.2 | 0.2 | 0.2 | 0.5 | 0.6 |
|     | 0.6 | 0.4 | 0.4 | 0.5 | 0.6 |

Analysis of the data above shows the following over an area of 3.0 mm×2.25 mm the maximum value for $|\sin \delta|$ is 0.2 over an area of 3.75 mm×3.0 mm the maximum value for $|\sin \delta|$ is 0.6 over an area of 4.0 mm×4.5 mm the maximum value for $|\sin \delta|$ is 0.9

EXAMPLE 5

A batch of stichels (graphical tools) were produced to the same design using the material of the invention and natural type Ia ('Cape') diamond as normally selected for this application. The tests were made using a Hell Gravure Systems GmbH K202 machine operating at 4000 Hz. The stichel design used in the test was a standard 130° design, where the angle refers to that of the leading edge.

The lifetime of a stichel was determined to be the duration for which the tip of the stichel forming the indentation was within specification, and measured to be on average 300 hrs for the natural type Ia stichels and 496 hrs for the CVD synthetic diamond stichels made from the material of this invention.

The low stress and absence of inclusions and other crystal imperfections of single crystal CVD diamond was also found to virtually eliminate the risk of breakage and early catastrophic failure of the stichels, which itself is of substantial benefit to the application. The wear pattern of the CVD stichels was also more predictable, so that life performance was more easily characterised and accommodated. In particular, the absence of chip-outs on the cutting line of the graphical tool gave a smoother surface in the engraved indentations which resulted in better control of the release of ink to the paper.

EXAMPLE 6

8 sets of homoepitaxial CVD diamond layers were synthesised according to the method described in Example 1. The CVD diamond layers had lateral dimensions of up to 6.5 mm and thicknesses of up to 3.2 mm. From these CVD diamond layers a total of 48 plates were prepared as optically polished plates with lateral dimensions of typically 4.0×4.0 mm and thicknesses of 1.2510±0.00025 mm.

Surface roughness for 15 of these plates was measured with a Zygo NewView 5000 scanning white light interferometer using a 20× magnification interferometric objective of the Mireau type and the Zygo MetroPro software package. Zoom was set at 1×. Camera resolution was 640×460 pixels with 20 Hz refresh rate. Field of view was 0.36×0.27 mm and the lateral resolution was 0.56 µm. A software bandpass filter was used with cut-off spatial frequencies of 12.5 and 400 lines/mm. A least squares fit to the surface profile was made in which the piston, tilt, power and astigmatism related to the overall surface position, angular orientation and form were removed. The remaining deviations from the reference surface thus defined were filtered with the bandpass filter and the root-mean-square value of the deviations was calculated. The roughness thus determined was found to vary between 0.5 and 1.5 nm between plates with an average value of 0.92 nm and standard deviation of 0.11 nm. Individual plates showed a much smaller standard deviation of less than 0.05 nm when measuring at 5 different randomly chosen positions over the full 4.0×4.0 mm surface area.

EXAMPLE 7

A homoepitaxial CVD diamond layer was synthesised according to the method described in Example 1. It was then prepared as an optical plate, with six polished {100} faces and with dimensions of 4.00 mm×3.65 mm×1.31 mm.

Sets of Deltascan images, each covering 1 mm×0.75 mm, were recorded at a wavelength of 589.6 nm for each of the three mutually perpendicular viewing directions normal to the faces of the sample. Each Deltascan sin δ image was analysed for the maximum values of sin δ in the manner described earlier, using 100% of the data obtained within the frame.

The maximum value of sin δ for the sin δ map recorded with the viewing direction parallel to the 4.00 mm dimension of the plate was 0.1. Likewise, the maximum value of sin δ for the sin δ map recorded with the viewing direction parallel to the 3.65 mm dimension of the plate was 0.1. A maximum value of $\Delta n_{[average]}$, the average value of the difference between the refractive index for light polarised parallel to the slow and fast axes, was then calculated for each of these two viewing orientations and found to be approximately $3 \times 10^{-6}$.

The values obtained with the viewing direction perpendicular to the two largest dimensions and parallel to the 1.31 mm dimension are shown in the sin δ map below. This viewing direction corresponds to the growth direction of the CVD diamond layer, and thus is parallel to the dominant direction of dislocations in the material.

The Deltascan map of the sample, with the viewing direction parallel to the 1.31 mm dimension of the plate, showing the maximum value of |sin δ| in each frame of 1 mm×0.75 mm is shown immediately below.

| 0.1 | 0.2 | 0.1 | 0.1 |
|-----|-----|-----|-----|
| 0.1 | 0.2 | 0.1 | 0.1 |
| 0.2 | 0.2 | 0.1 | 0.1 |
| 0.3 | 0.2 | 0.2 | 0.2 |
| 0.2 | 0.1 | 0.1 | 0.1 |
| 0.1 | 0.1 | 0.1 | 0.1 |

The corresponding maximum values of $\Delta n_{[average]}$ for each frame in this viewing direction can be calculated based on the corresponding sin δ value and the sample thickness, with the values given below:

| Sin δ | 0.10 | 0.20 | 0.30 |
|-------|------|------|------|
| Δn | $7.2 \times 10^{-6}$ | $1.4 \times 10^{-5}$ | $2.2 \times 10^{-5}$ |

In some wear applications, the presence of randomly scattered points, or even a single point, of higher stress may be limiting, causing pitting or roughness to develop on a wear surface and enhancing the wear rate of either that surface or the mating surface. The data in this example, using every data pixel measured across the sample, shows that material grown using the method of the invention can achieve extremely low levels of strain related birefringence both generally across the sample and also locally.

The invention claimed is:

1. A body of single crystal diamond produced by CVD for use in a wear application, wherein the wear rate of a wear surface of the diamond is no greater than 0.11 μm/min when measured by processing the diamond into at least five sinter-mounted wire drawing dies with a minimum hole diameter in the range of 80 μm, specified to within 0.15 μm diameter and with an ovality of less than 0.1 μm, and with a reduction angle of 10-12°, and then with a Heinrich HZ10 machine drawing stainless steel wire DIN 1.4301 through each die with wet drawing with a mineral oil coolant and a drawing speed 10 m/s, and measuring the diameter and ovality of the wire at the beginning of the test and at various times with a Zumbach ODAC 16J laser diameter measuring system, and then obtaining an average wear rate for the at least five wire drawing dies,
wherein the body of single crystal diamond has a nitrogen concentration, in the form of the single substitutional nitrogen centre as measured by EPR, with a lower concentration limit of $2 \times 10^{16}$ atoms/cm$^3$ and an upper concentration limit of $1 \times 10^{19}$ atoms/cm$^3$.

2. The body of single crystal diamond according to claim 1, wherein the wear rate is no greater than 0.10 μm/min.

3. The body of single crystal diamond according to claim 2, wherein the wear rate is no greater than 0.095 μm/min.

4. The body of single crystal diamond according to claim 3, wherein the wear rate is no greater than 0.090 μm/min.

5. The body of single crystal diamond according to claim 1, wherein the wear surface is formed from a single growth sector.

6. The body of single crystal diamond according to claim 5, wherein the single growth sector is selected from the group comprising the {100}, the {113}, the {111} and {110} growth sectors.

7. The body of single crystal diamond according to claim 6, wherein the single growth sector is the {100} growth sector.

8. The body of single crystal diamond according to claim 1, wherein the body exhibits a low birefringence indicative of low strain such that in a sample of a specified thickness of at least 0.4 mm, and measured over a specified area of at least 1.0 mm×1.0 mm, the modulus of the sine of the phase shift, |sin δ|, for at least 95% of the analysed area of the sample remains in first order (δ does not exceed Π/2) and the |sin δ| does not exceed 0.9.

9. The body of single crystal diamond according to claim 8, wherein |sin δ| does not exceed 0.6.

10. The body of single crystal diamond according to claim 1, wherein the body exhibits a low birefringence indicative of low strain such that in a sample of a specified thickness of at least 0.4 mm, and measured over a specified area of at least 1.0 mm×1.0 mm, for at least 95% of the area analysed, the sample remains in first order (δ does not exceed 7r/2), and the maximum value of $\Delta n_{[average]}$, the average value of the difference between the refractive index for light polarised parallel to the slow and fast axes averaged over the sample thickness, does not exceed $1.5 \times 10^{-4}$.

11. The body of single crystal diamond according to claim 10, wherein the maximum value of $\Delta n_{[average]}$ does not exceed $5 \times 10^{-5}$.

12. The body of single crystal diamond according to claim 1, wherein the body possesses an ability to be processed to show a high surface polish with an $R_a$ (arithmetic mean of the absolute deviation from the mean line through the profile) measured over a specified area of at least 1.0 mm×1.0 mm less than 2 nm.

13. The body of single crystal diamond according to claim 1, wherein the wear surface of the body is selected such that the characteristic dislocation direction in the material is at least 30° away from the normal to the wear surface.

14. The body of single crystal diamond according to claim 1, wherein the body has been annealed.

15. The body of single crystal CVD diamond according to claim 1, wherein the wear surface of the body is selected such that the characteristic dislocation direction in the material is at least 30° away from the normal to the wear surface.

16. The body of single crystal CVD diamond according to claim 1, wherein the body has been annealed.

17. The body of single crystal diamond according to claim 1, in layer form and which is free standing or forms a layer or region of a larger diamond body or layer.

18. The body of single crystal diamond according to claim 17, wherein the larger diamond body or layer is single crystal or polycrystalline diamond produced by CVD or other synthetic method.

19. The body of single crystal diamond according to claim 1, prepared for use as a wire drawing die, a graphical tool, stichel, a high pressure fluid jet nozzle, or a high pressure water jet nozzle.

20. The body of single crystal diamond according to claim 19, wherein the body is prepared for use as a high pressure fluid jet nozzle, where the fluid comprises more than one type of liquid, or gas, or a combination of the two.

21. The body of single crystal diamond according to claim 19, wherein the body is prepared for use as a high pressure fluid jet nozzle, where the fluid comprises at least one liquid or gas and in addition one or more types of solid particle.

22. The wear component comprising a body of single crystal diamond produced by CVD and having at least one wear surface, wherein the body of single crystal diamond is as defined in claim 1.

* * * * *